United States Patent
Yu et al.

(10) Patent No.: US 11,296,152 B2
(45) Date of Patent: Apr. 5, 2022

(54) ARRAY SUBSTRATE WITH COLOR CONVERSION LUMINESCENCE LAYERS, MANUFACTURING METHOD THEREOF, DISPLAY PANEL, AND DISPLAY APPARATUS

(71) Applicant: BOE TECHNOLOGY GROUP CO., LTD., Beijing (CN)

(72) Inventors: Yong Yu, Beijing (CN); Yang Yue, Beijing (CN); Jiangnan Lu, Beijing (CN); Shi Shu, Beijing (CN); Chuanxiang Xu, Beijing (CN); Haitao Huang, Beijing (CN); Xiang Li, Beijing (CN); Min Huang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 100 days.

(21) Appl. No.: 16/755,777

(22) PCT Filed: Oct. 18, 2019

(86) PCT No.: PCT/CN2019/111974
§ 371 (c)(1),
(2) Date: Apr. 13, 2020

(87) PCT Pub. No.: WO2020/192096
PCT Pub. Date: Oct. 1, 2020

(65) Prior Publication Data
US 2021/0225956 A1   Jul. 22, 2021

(30) Foreign Application Priority Data
Mar. 27, 2019   (CN) .................. 201910236627.X

(51) Int. Cl.
*H01L 29/08* (2006.01)
*H01L 27/32* (2006.01)
(Continued)

(52) U.S. Cl.
CPC .......... *H01L 27/3218* (2013.01); *C09K 11/06* (2013.01); *H01L 27/3216* (2013.01);
(Continued)

(58) Field of Classification Search
CPC ........................... H01L 27/3218; C09K 11/06
See application file for complete search history.

(56) References Cited

U.S. PATENT DOCUMENTS 7,696,681 B2 *  4/2010  Park .................... H01L 51/5036
                                                        313/503
9,755,173 B2    9/2017  Riegel et al.
(Continued)

FOREIGN PATENT DOCUMENTS

CN   103865538 A   6/2014
CN   105870287 A   8/2016
(Continued)

OTHER PUBLICATIONS

International Search Report dated Jan. 19, 2020, issued in counterpart Application No. PCT/CN2019/111974. (11 pages).
(Continued)

*Primary Examiner* — Caleb E Henry
(74) *Attorney, Agent, or Firm* — WHDA, LLP

(57) ABSTRACT

The present disclosure is related to an array substrate. The array substrate may include a substrate; and a plurality of sub-pixels emitting different colors of light on the substrate. Each of the plurality of sub-pixels may include a green electroluminescence component, and each of the plurality of the sub-pixels other than green sub-pixels further may
(Continued)

include a color conversion layer on a light-exiting side of the green electroluminescence component.

18 Claims, 9 Drawing Sheets

(51) Int. Cl.
 C09K 11/06 (2006.01)
 H01L 51/50 (2006.01)
 H01L 51/52 (2006.01)
 H01L 51/56 (2006.01)

(52) U.S. Cl.
 CPC ...... *H01L 27/3258* (2013.01); *H01L 51/5036* (2013.01); *H01L 51/5268* (2013.01); *H01L 51/56* (2013.01)

(56) References Cited

U.S. PATENT DOCUMENTS

| | | | | |
|---|---|---|---|---|
| 2005/0140275 A1* | 6/2005 | Park | ............... | H01L 27/322 313/504 |
| 2005/0140276 A1* | 6/2005 | Park | ............... | H01L 27/322 313/504 |
| 2007/0108900 A1* | 5/2007 | Boek | ............... | G02B 5/0226 313/506 |
| 2015/0249115 A1* | 9/2015 | Chen | ............... | H01L 51/56 257/40 |
| 2016/0005797 A1* | 1/2016 | Huang | ............... | H01L 51/5234 257/40 |
| 2016/0013251 A1* | 1/2016 | Yoshida | ............... | H01L 27/3218 257/40 |
| 2016/0315125 A1* | 10/2016 | Kikuchi | ............... | G02B 5/223 |
| 2017/0069697 A1* | 3/2017 | Hashimoto | ............... | H01L 27/3246 |
| 2017/0077190 A1* | 3/2017 | Hashimoto | ............... | H05B 33/10 |
| 2017/0186971 A1* | 6/2017 | Kanamoto | ............... | H01L 51/0071 |
| 2017/0324054 A1* | 11/2017 | Ishisone | ............... | H01L 51/5004 |
| 2018/0180951 A1* | 6/2018 | Toyotaka | ............... | H01L 27/3258 |
| 2019/0207156 A1* | 7/2019 | Gil | ............... | H01L 27/326 |

FOREIGN PATENT DOCUMENTS

| | | |
|---|---|---|
| CN | 106876433 A | 6/2017 |
| CN | 109920833 A | 6/2019 |

OTHER PUBLICATIONS

Office Action dated May 28, 2020, issued in counterpart CN Application No. 201910236627.X, with English Translation. (12 pages).

\* cited by examiner

ARRAY SUBSTRATE WITH COLOR CONVERSION LUMINESCENCE LAYERS, MANUFACTURING METHOD THEREOF, DISPLAY PANEL, AND DISPLAY APPARATUS

CROSS-REFERENCE TO RELATED APPLICATIONS

This application claims benefit of the filing date of Chinese Patent Application No. 201910236627.X filed on Mar. 27, 2019, the disclosure of which is hereby incorporated in its entirety by reference.

TECHNICAL FIELD

The disclosure relates to the field of display technology, in particular, to an array substrate, a manufacturing method thereof, a display panel, and a display apparatus.

BACKGROUND

Organic Light Emitting Diode (OLED) display products are widely used in Augmented Reality (AR) products due to its advantageous characteristics such as high resolution, high color gamut, and low power consumption. AR products usually have higher brightness requirements due to their use environment. However, brightness problem has always been a major constraint on AR products due to product design and optical path design. The OLED structure in the prior art applied to the AR product mainly adopts a monochrome OLED component, and specifically includes the following arrangement modes: a structure of a white light OLED (WOLED) combined with a color film (CF), a structure of a WOLED combined with a fluorescence and a CF, or a structure of a blue OLED combined with a fluorescence and a CF. The structure of WOLED combined with fluorescence and a CF can improve the brightness compared with the structure of WOLED combined with a CF. However, because the red phosphor absorption spectrum is mainly in the green band and the blue band and the green phosphor mainly absorbs light of the blue band, the utilization rate of fluorescence on the backlight is not high in the structure of WOLED combined with fluorescence and CF, thereby resulting in limited brightness improvement of the final product. For the structure of the blue OLED combined with fluorescence and CF, blue color has the lowest brightness among the three primary colors, so the brightness of the display product is still not ideal. Furthermore, the lifetime and stability of the blue OLED are poor, which affects the application of the blue OLED device.

In summary, the monochrome OLED display products in the prior art have low brightness and poor display performance.

BRIEF SUMMARY

An embodiment of the present disclosure provides an array substrate. The array substrate may include a substrate; and a plurality of sub-pixels emitting different colors of light on the substrate. Each of the plurality of sub-pixels may include a green electroluminescence component, and each of the plurality of the sub-pixels other than green sub-pixels further may include a color conversion layer on a light-exiting side of the green electroluminescence component.

Optionally, the plurality of sub-pixels comprises red sub-pixels and the color conversion layer in each of the red sub-pixels comprises a first up-conversion luminescence layer that converts green light into red light.

Optionally, the first up-conversion luminescence layer comprises one or a combination of materials selected from the group consisting of isothiocyanate (FITC), 5-carboxyfluorescein (FAM), cyan dye (Cy2), and a fluorescent dye.

Optionally, wherein the plurality of sub-pixels comprise blue sub-pixels, and the color conversion layer in each of the blue sub-pixels comprises a down-conversion luminescence layer that converts green light into near-infrared light, and an second up-conversion luminescence layer that converts the near-infrared light into blue light on a light-exiting side of the down-conversion luminescence layer.

Optionally, the down-conversion luminescence layer comprises a fluoroboron-based fluorescent dye.

Optionally, the second up-conversion luminescence layer comprises a rare earth doped fluorescent dye.

Optionally, the rare earth doped fluorescent dye comprises a $Yb^{3+}/Tm^{3+}$ co-doped $Sb_2O_4$ phosphor.

Optionally, each of the blue sub-pixels further comprises a blue color resist on a light-exiting side of the second up-conversion luminescence layer.

Optionally, each of the green sub-pixels further comprises a green color resist on the light exiting side of the green electroluminescence component.

Optionally, each of the red sub-pixels further comprises a red color resist on a light-exiting side of the first up-conversion luminescence layer.

Optionally, each of the green sub-pixels further comprises a scattering structure on the light exiting side of the green electroluminescence component.

Optionally, each of the green sub-pixels further comprises a scattering structure on the light exiting side of only the green electroluminescence component.

Optionally, the light-exiting side of the green electroluminescent component of each of the green sub-pixels is provided a light-transmitting insulating layer, and the scattering structure is an uneven light-exiting surface of the light-transmitting insulating layer.

Optionally, each of the plurality of sub-pixels other than the green sub-pixels further comprises a light-transmitting insulating layer between the green electroluminescence component and the color conversion layer, and the scattering structure is an uneven light-exiting surface of the light-transmitting insulating layer.

Optionally, the light-transmitting insulating layer is in direct contact with the substrate, and has a higher refractive index than the substrate.

Optionally, the light-transmitting insulating layer comprises silicon oxide and/or aluminum oxide.

One embodiment of the present disclosure provides a method of manufacturing an array substrate, comprising forming a plurality of sub-pixels emitting different colors of light on a substrate, each of the plurality of sub-pixels including a green electroluminescence component; and forming a color conversion layer over the green electroluminescent component in each of the plurality of sub-pixels other than green sub-pixels.

Optionally, before forming the color conversion layer, the method further comprises forming a light-transmitting insulating layer on the green electroluminescent component.

Optionally, after forming the color conversion layer over the green electroluminescent component in each of the plurality of sub-pixels other than the green sub-pixels, the method further comprises etching a surface of the light-transmitting insulating layer in each of the green sub-pixels to form an uneven light-exiting surface by an etching process.

One embodiment of the present disclosure is a display panel comprising the array substrate according to one embodiment of the present disclosure.

One embodiment of the present disclosure is a display apparatus comprising the display panel according to one embodiment of the present disclosure.

BRIEF DESCRIPTION OF THE DRAWINGS

In order to more clearly illustrate the technical solutions in the embodiments of the present disclosure, the following drawings will be briefly described in the description of the embodiments. It is obvious that the drawings in the following description are only some embodiments of the present disclosure, so those skilled in the art can also obtain other drawings based on these drawings without any creative work.

DETAILED DESCRIPTION

Figure 1:
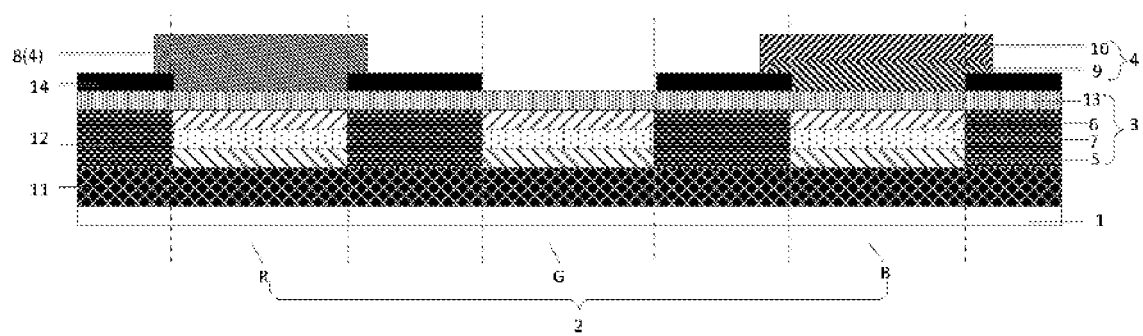
FIG. 1 is a schematic structural diagram of an array substrate provided by one embodiment of the present disclosure.

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-8. When referring to the figures, like structures and elements shown throughout are indicated with like reference numerals.

Unless otherwise defined, technical terms or scientific terms used in the present disclosure are intended to be in the ordinary meaning of those of ordinary skill in the art. The words "first," "second" and similar words used in the present disclosure do not denote any order, quantity or importance, but are merely used to distinguish different components.

In the description of the following embodiments, specific features, structures, materials or characteristics may be combined in any suitable manner in any one or more embodiments or examples.

As shown in FIG. 1, one embodiment of the present disclosure provides an array substrate, which includes: a substrate 1 and a plurality of sub-pixels 2 emitting different colors of light on the substrate. Each of the sub-pixels 2 includes a green electroluminescence component 3. The other color sub-pixels other than the green sub-pixels G each can further include: a color conversion layer 4 located on a light-exiting side of the green electroluminescence component 3. The green electroluminescence component 3 emits green light.

In an array substrate provided by one embodiment of the present disclosure, each sub-pixel includes a green electroluminescence component 3, and the sub-pixels other than the green sub-pixels convert the green light into the light of the corresponding color through the color conversion layer 4. Since green light has the highest brightness among the three primary colors of light, and the green sub-pixel does not need to pass through the color conversion layer, the green pixel has very low luminance loss. Therefore, adopting the green electroluminescence component can improve brightness of the array substrate and the display effect, and also enhance user experience.

Optionally, in an array substrate shown in FIG. 1, the sub-pixel includes a red sub-pixel R. The color conversion layer 4 in the red sub-pixel R includes a first up-conversion luminescence layer 8 for converting green light into red light.

In an array substrate provided by one embodiment of the present disclosure, the electroluminescence component may be an OLED component. The color conversion layer in the red sub-pixel includes a first up-conversion luminescence layer that converts green light into red light. The absorption spectrum of the first up-conversion luminescence layer is 430 am to 580 nm, which closely matches the emission spectrum of green OLED, which is 480 nm to 580 nm. Therefore, the array substrate provided in the embodiment of the present disclosure can completely absorb the light emitted by the green electroluminescence component, and then convert it into red light. In this way, the light utilization efficiency is high, and the brightness of the array substrate can be further improved.

Optionally, the first up-conversion luminescence layer that converts green light into red light comprises one or a combination of the following: fluorescein isothiocyanate (FITC), 5-carboxyfluorescein (FAM), and cyan dye (Cy2).

The first up-conversion luminescence layer that converts green light to red light may also include: Alexa Fluor Series No. 488 fluorescent dye (Alexa Fluor 488), CF Series No. 488A fluorescent dye (CF 488A) or DyLight Series No. 488 fluorescent dye (DyLight 488).

Optionally, in an array substrate shown in FIG. 1, the sub-pixels further include a blue sub-pixel B. A color conversion layer 4 in the blue sub-pixel B includes: a down-conversion luminescence layer 9 that converts green light into near-infrared light, and a second up-conversion luminescence layer 10 on a light-exiting side of the down-conversion luminescence layer 9 that converts near-infrared light into blue light.

The array substrate provided by the embodiment of the present disclosure has high light utilization efficiency when converting green light into near-infrared light by using a down-conversion luminescence layer, and converting near-infrared light into blue light by using a second up-conversion luminescence layer. In contrast, the up-conversion efficiency of the blue light directly excited from the green light is low and its lifetime is short. Therefore, the color conversion layer in the blue sub-pixel of the array substrate provided by one embodiment of the present disclosure can guarantee the light conversion efficiency and the lifetime when converting green light into blue light, thereby further improving the brightness of the array substrate.

Optionally, the down-conversion luminescence layer that converts green light into near-infrared light comprises: a fluoroboron-based fluorescent dye.

Optionally, the second up-conversion luminescence layer that converts near-infrared light into blue light comprises: a rare earth doped fluorescent dye.

Optionally, the rare earth doped fluorescent dye is a $Yb^{3+}/Tm^{3+}$ co-doped $Sb_2O_4$ phosphor.

Figure 2:
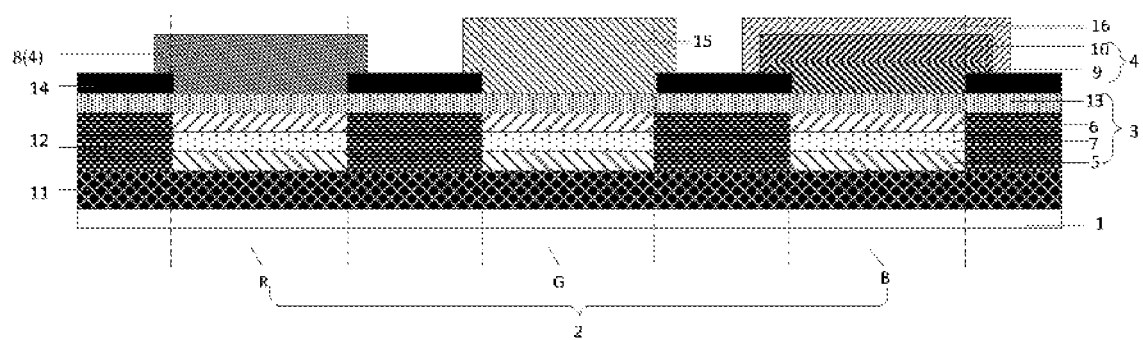
FIG. 2 is a schematic structural diagram of an array substrate provided by one embodiment of the present disclosure.

Optionally, as shown in FIG. 2, the green sub-pixel G further includes a green color resist 15 located on the light exiting side of the green electroluminescence component 3.

Optionally, as shown in FIG. 2, the blue sub-pixel B further includes a blue color resist 16 located on the light-exiting side of the second up-conversion luminescence layer 10 that converts near-infrared light into blue light.

It should be noted that, for the array substrate provided by the embodiment of the present disclosure, a color resist may be set according to actual needs. For example, a color resist may be set according to a desired color gamut. For a certain sub-pixel, if the light emitted without the color resist already meets standard, the sub-pixel can be set without a color resist.

In one array substrate provided by one embodiment of the present disclosure, the color conversion layer in the red sub-pixel can completely absorb the light emitted by the green electroluminescence component and convert it into red light. In principle, it is not necessary to set a red color resist, as shown in FIG. 2. It is shown that the green sub-pixel G and the blue sub-pixel B both include a color resist, and the red sub-pixel R does not have a color resist. Since the color resist is not set in the red sub-pixel, the fabrication process of the array substrate can be simplified.

Figure 3:
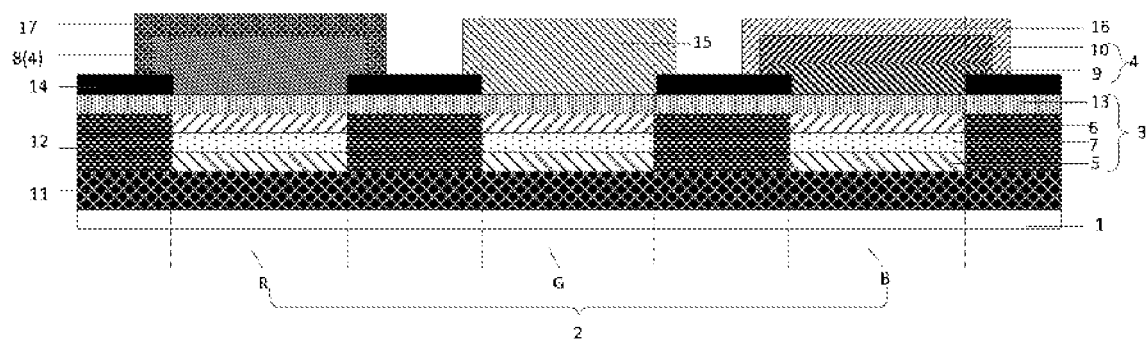
FIG. 3 is a schematic structural diagram of an array substrate provided by one embodiment of the present disclosure.

Of course, as shown in FIG. 3, the red sub-pixel can further include a red color resist 17 located on the light-exiting side of the up-conversion luminescence material that converts green light into red light.

Figure 4:
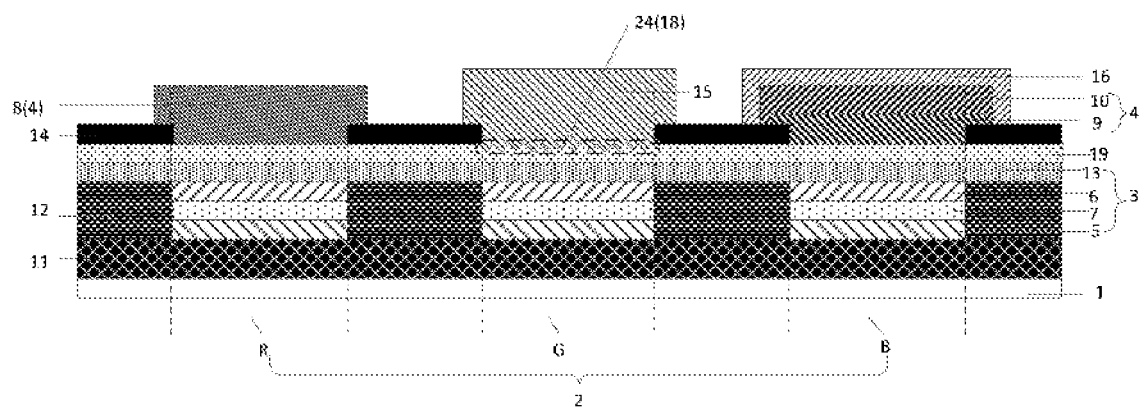
FIG. 4 is a schematic structural diagram of an array substrate provided by one embodiment of the present disclosure.

Optionally, as shown in FIG. 4, the green sub-pixel can further include a scattering structure 18 on the light-exiting side of the green electroluminescence component.

Figure 5:
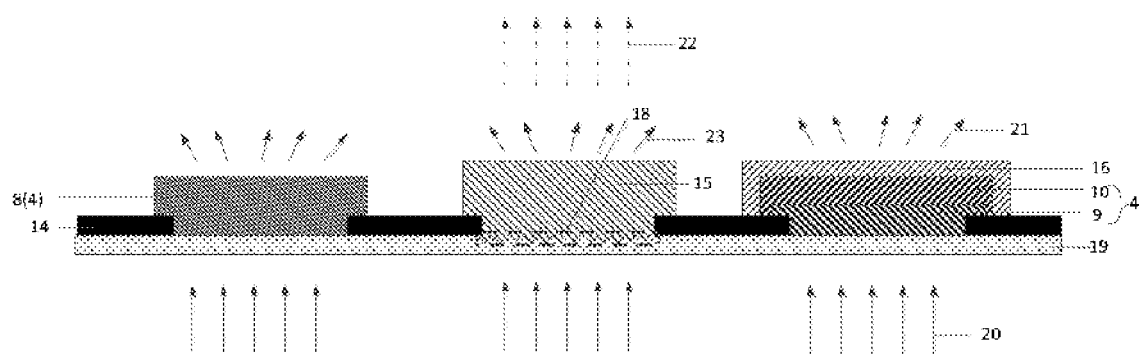
FIG. 5 is a schematic diagram of a direction of propagation of light of an array substrate provided by an embodiment of the present disclosure.

It should be noted that, as shown in FIG. 5, since the red sub-pixel and the blue sub-pixel each are provided with the color conversion layer, a light 20 emitted by the green electroluminescence component passes through the color conversion layer 4 to become a light 21 propagating in various directions, which is equivalent to being scattered. If the green sub-pixel is not provided with a scattering structure, the light 22 emitted by the green sub-pixel is in the same direction as the light 20 emitted by the green electroluminescence component, so that the green light has stronger brightness at direct viewing angle and weaker brightness at indirect viewing angles. That is, the brightness of green light is not balanced at different viewing angles. In the case where the green sub-pixel includes a scattering structure, the propagating direction of the light 22 emitted by the green sub-pixel is changed by the scattering structure 18, so that the light 23 emitted by the green sub-pixel propagates in various directions, thereby avoiding the imbalance of the green light brightness at different viewing angles.

In the array substrate provided by one embodiment of the present disclosure, since the green sub-pixel is provided with a scattering structure, the light emitted by the green electroluminescence component changes direction of light propagation through the scattering structure. Accordingly, the diffuse reflection and scattering of the light is increased compared to that without the scattering structure, thereby avoiding the brightness imbalance of the green light at different viewing angles.

Optionally, in an array substrate provided by one embodiment of the present disclosure, as shown in FIG. 4, the light-exiting side of the green electroluminescence component 3 of the green sub-pixel G has a light-transmitting insulating layer 19, and the scattering structure 18 is the uneven light-exiting surface 24 of the light-transmitting insulating layer 19. The uneven light-exiting surface of the light-transmitting insulating layer may include regular or irregular patterns.

Optionally, in an array substrate provided by one embodiment of the present disclosure, as shown in FIG. 4, the colorful sub-pixels other than the green sub-pixels G each further include: a light-transmitting insulating layer 19 between the green electroluminescence component 3 and the color conversion layer 4.

The array substrate provided by one embodiment of the present disclosure includes a light-transmitting insulating layer disposed in a whole layer, and the patterning process of the light-transmitting insulating layer is not required, thereby simplifying the process of manufacturing the array substrate.

For the light-transmitting insulating layer, in some embodiments, a high refractive index material can be selected. Optionally, the material comprises one or a combination of the following: silicon oxide and aluminum oxide.

Optionally, the green electroluminescence component comprises: a first electrode 5, a second electrode 6, and a green light emitting function layer 7 disposed between the first electrode 5 and the second electrode 6. In one embodiment, an array substrate, as shown in FIG. 1, further includes a second planarization layer 13 disposed on the second electrode 6. The first electrode may, for example, be an anode and the second electrode may, for example, be a cathode.

Figure 6:
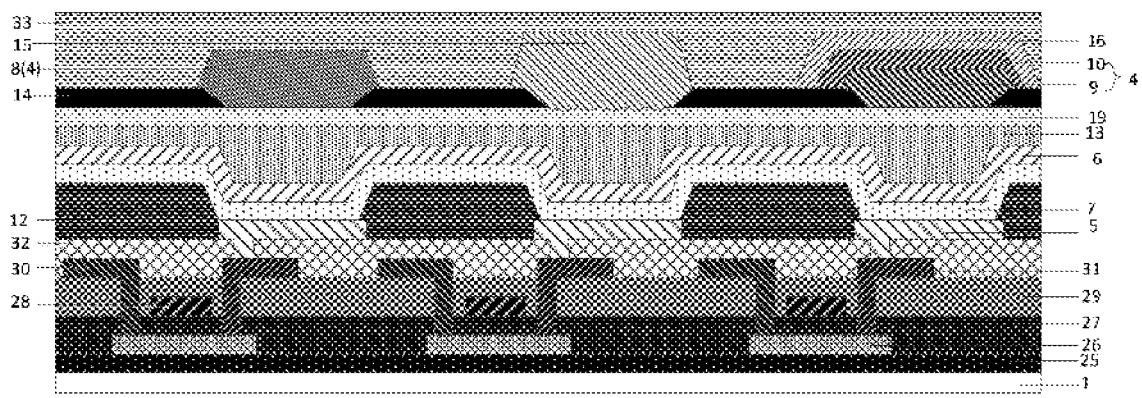
FIG. 6 is a schematic structural diagram of an array substrate provided by one embodiment of the present disclosure.

An array substrate, as shown in FIGS. 1 to 4, provided by some embodiments of the present disclosure further includes: a pixel circuit 11, a pixel defining layer 12, and a black matrix 14. In one embodiment, as shown in FIG. 6, the pixel circuit 11 includes a buffer layer 25 over the substrate, an active layer 26 of a thin film transistor over the buffer layer 25, a gate insulating layer 27, a gate 28, an interlayer insulation layer, a solve 30 and a drain 31, a first planarization layer 32 disposed over the thin film transistor. The first electrode 5 of the green electroluminescence component is connected to the drain 31 of the thin film transistor that drives the electroluminescence component to emit light. The pixel defining layer 12 is located above the first planarization layer 32 to define a light emitting region of the sub-pixel, and the black matrix 14 is located above the light-transmitting insulating layer 19. The army substrate shown in FIG. 6 further includes color resists, color conversion layers 4, and a third planarization layer 33 disposed over the black matrix 14.

In one embodiment, as shown in FIG. 6, the thin film transistor is a top gate structure. Of course, the thin film transistor may also be a bottom gate structure.

Figure 7:
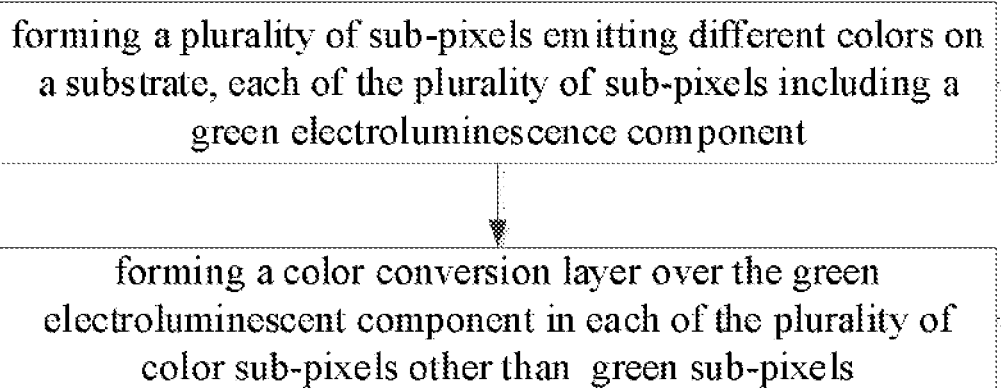
FIG. 7 is a flow chart of a method for manufacturing an array substrate provided by one embodiment of the present disclosure.

Based on the same inventive concept, one embodiment of the present disclosure further provides a method for manufacturing an array substrate, as shown in FIG. 7, including:

Step S101 includes forming a plurality of sub-pixels having different light-emitting colors each including a green electroluminescence component on the base substrate;

Step S102 includes forming a color conversion layer on the green electroluminescence component in each of the colorful sub-pixels other than the green sub-pixels.

Optionally, step S101 of forming a plurality of sub-pixels having different light-emitting colors each including a green electroluminescence component on the base substrate includes:

Forming a buffer layer, a thin film transistor layer, and a planarization layer on the base substrate sequentially, wherein the thin film transistor layer includes a driving transistor that drives the green electroluminescence component;

Forming a first electrode and a pixel defining layer on the planarization layer, wherein the first electrode is electrically connected to the driving transistor through a via hole in the planarization layer, and Forming a green light emitting functional layer, a second electrode, and a second planarization layer of the electroluminescence component in this order.

Optionally, step S102 of forming a color conversion layer on the green electroluminescence component in colorful sub-pixels other than the green sub-pixels includes:

Forming an up-conversion luminescence material on the green electroluminescence component that converts green light into red light in a red sub-pixel;

Forming a down-conversion luminescence material that converts green light into near-infrared light on the green electroluminescence component in a blue sub-pixel; and Forming an up-conversion luminescence material that converts near-infrared light into blue light on the down-conversion luminescence material that converts green light to near-infrared light.

Optionally, before forming the color conversion layer, step 102 may further includes:

Forming a light-transmitting insulating layer on the green electroluminescence component;

After forming the color conversion layers on the green electroluminescence component at each of the sub-pixels other than the green sub-pixels, the method may further include:

Forming an uneven light-exiting surface on the surface of the light-transmitting insulating layer located in the green sub-pixel by an etching process.

Optionally, forming a light-transmitting insulating layer on the green electroluminescence component may include:

Forming a light-transmitting insulating layer disposed over the planarization layer of the green electroluminescence component.

In some embodiments, a silicon oxide or aluminum oxide may be deposited by a plasma vapor deposition (PECVD) process to form the light-transmitting insulating layer.

Optionally, after forming an up-conversion luminescence material that converts near-infrared light into blue light and before etching the surface of the light-transmitting insulating layer located in the green sub-pixel to form an uneven light-exiting surface by an etching process, the method for manufacturing an array substrate may also include forming a blue color resist on the up-conversion luminescence material that converts the near infrared light to blue light.

Optionally, after the surface of the light-transmitting insulating layer located in the green sub-pixel is etched to form an uneven light-exiting surface by using an etching process, the method further includes:

Forming a green color resist on the light-transmitting insulating layer in the green sub-pixel.

Optionally, after forming the light-transmitting insulating layer on the planarization layer of the green electroluminescence component and before forming the color conversion layer, the method further comprises: forming a black matrix on the light-transmitting insulating layer.

Figure 8A:
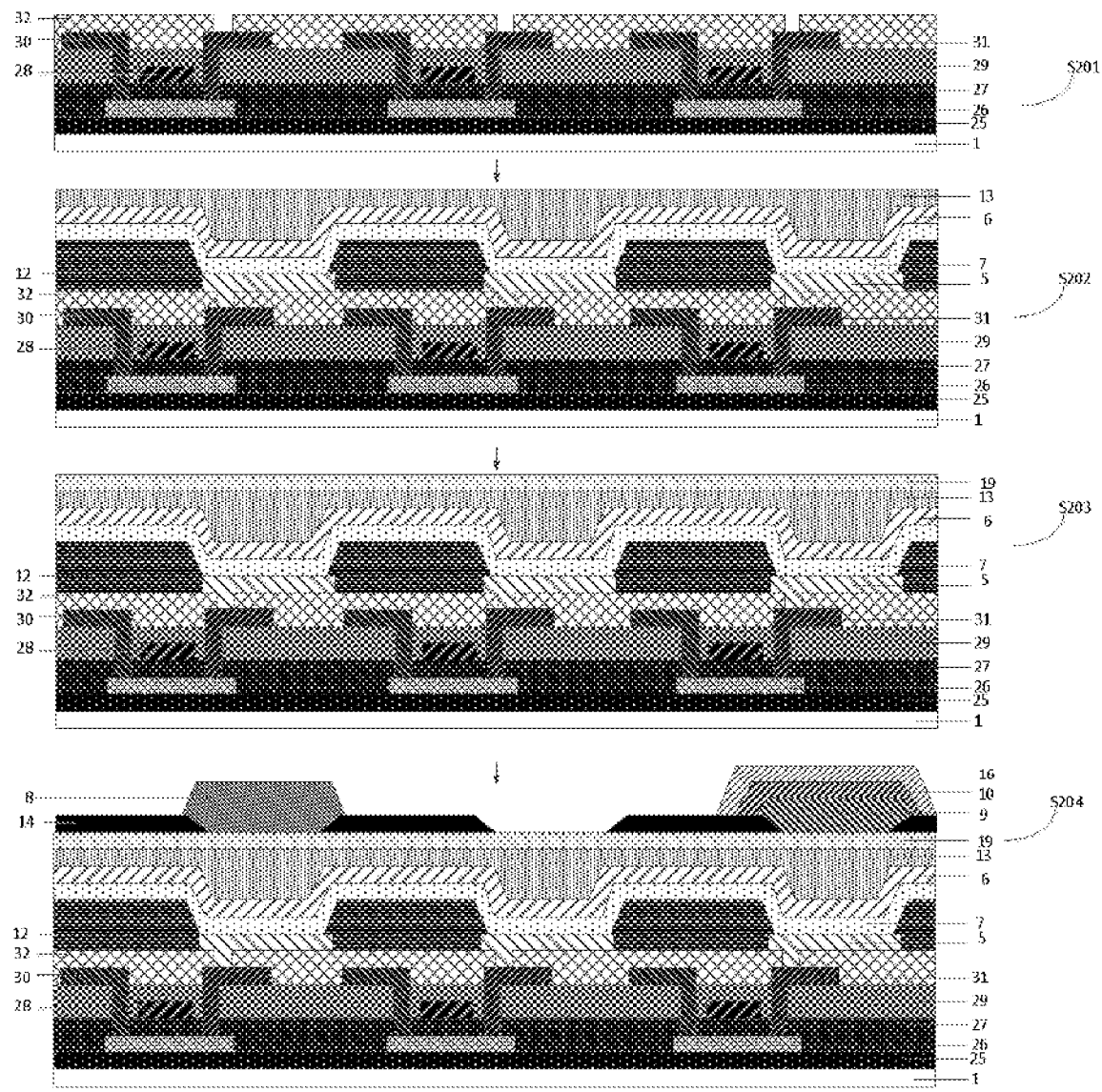
FIGS. 8 A&B show a schematic diagram of a method for manufacturing an array substrate provided by one embodiment of the present disclosure.
Figure 8B:
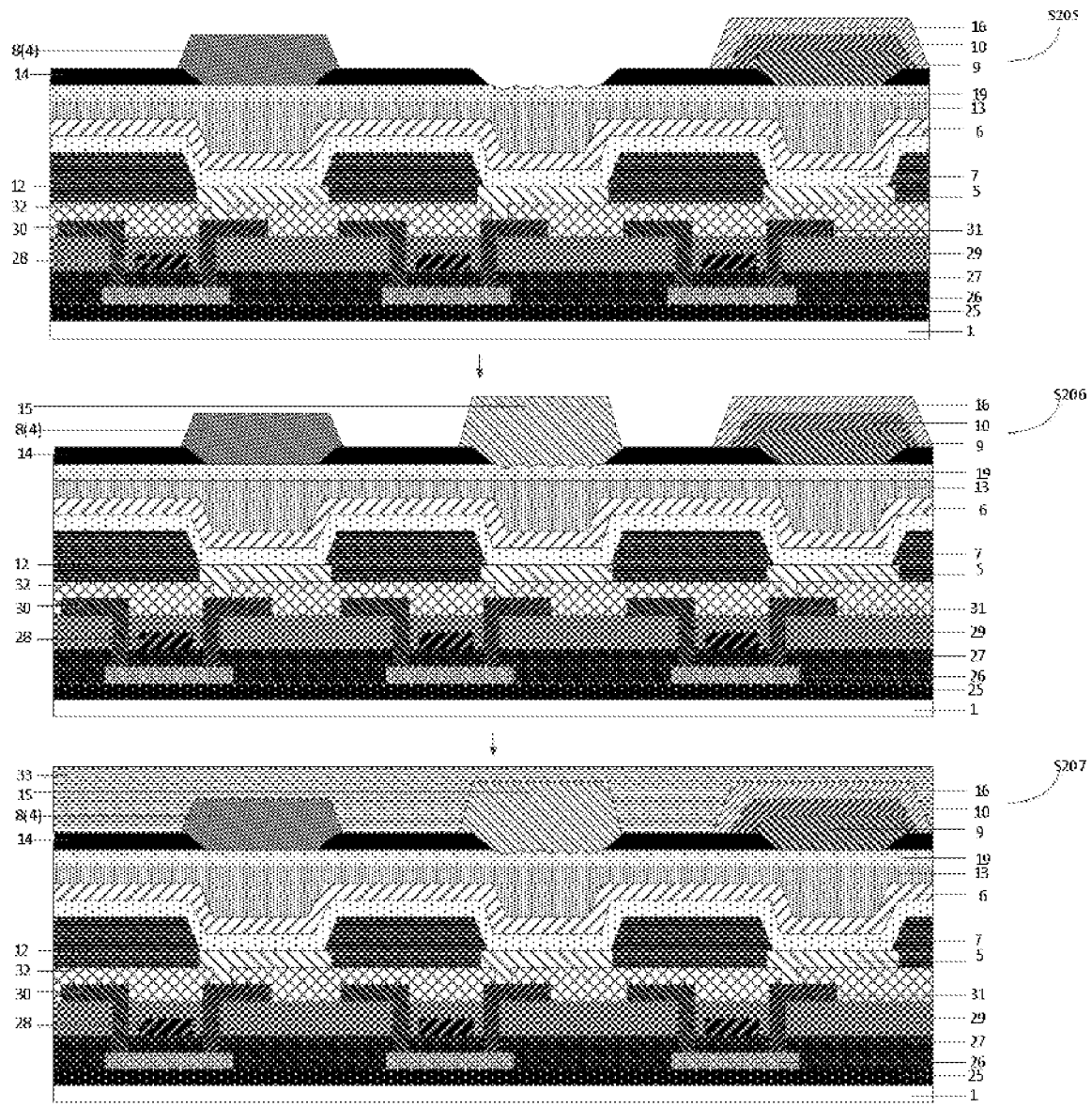

One method for manufacturing an array substrate provided by one embodiment of the present disclosure is shown in FIGS. 8A&B, which include the following steps:

Step S201 includes sequentially forming a buffer layer 25, an active layer 26, a gate insulating layer 27, a gate 28, an interlayer insulating layer 29, a source 30, a drain 31, and a first planarization layer 32 on a base substrate 1.

Step S202 includes forming a first electrode 5 and a pixel defining layer 12 on the first planarization layer 32, forming a green light emitting functional layer by evaporation deposition, forming a second electrode 6 on the green light emitting functional layer 7, and forming a second planarization layer 13 on the second electrode 6.

Step S203 includes forming a light-transmitting insulating layer on the second planarization layer 13.

In some embodiments, a light-transmitting insulating layer can be deposited by a PECVD process.

Step S204 includes forming a pattern of a black matrix on the light-transmitting insulating layer, forming a pattern of the up-conversion luminescence material that converts green light into red light on the light-transmitting insulating layer of the red sub-pixel, forming a down-conversion luminescence material that converts green light into near-infrared light and an up-conversion luminescence material that converts near-infrared light into blue light and a blue color resist on the light-transmitting insulating layer of the blue sub-pixel.

Step S205 includes etching the surface of the light-transmitting insulating layer located in the green sub-pixel using an etching process to form an uneven light-exiting surface.

Step S206 includes forming a green color resist on the light-transmitting insulating layer of the green sub-pixel.

Step S207 includes forming a third planarization layer.

A display panel provided by one embodiment of the present disclosure includes the above array substrate provided by one embodiment of the present disclosure.

A display apparatus provided by one embodiment of the present disclosure may be a mobile phone, a computer, or a television, etc.

Some embodiments of the present disclosure provide an array substrate, a manufacturing method thereof, a display panel, and a display apparatus, wherein a green electroluminescence component is provided in each sub-pixel, and the sub-pixels other than the green sub-pixels convert the green light into the light of the corresponding color through a color conversion layer. Since green light has the highest brightness among the three primary colors of light, and the green sub-pixels do not need to pass through a color conversion layer, the green sub-pixels have very low luminance loss. Therefore, adopting the green electroluminescence component can improve brightness of the array substrate and the display effect, and also enhance user experience. In an array substrate provided by one embodiment of the present disclosure, since the green sub-pixel is provided with a scattering structure, the light emitted by the green electroluminescence component changes direction of light propagation through the scattering structure. Accordingly, diffuse reflection and scattering of the light is increased compared to that without the scattering structure, thereby avoiding the brightness imbalance of the green light at different viewing angles.

To those skilled in the art that various modifications and changes can be made in the present disclosure without departing from the spirit and scope of the disclosure. Thus, it is intended that the present disclosure cover the modifications and variations of the present disclosure.

The principles and the embodiments of the present disclosure are set forth in the specification. The description of the embodiments of the present disclosure is only used to help understand the apparatus and method of the present disclosure and the core idea thereof. Meanwhile, for a person of ordinary skill in the art, the disclosure relates to the scope of the disclosure, and the technical scheme is not limited to the specific combination of the technical features, but also covers other technical schemes which are formed by combining the technical features or the equivalent features of the technical features without departing from the inventive concept. For example, a technical scheme may be obtained by replacing the features described above as disclosed in this disclosure (but not limited to) with similar features.

What is claimed is:

1. An array substrate, comprising:
    a substrate; and
    a plurality of sub-pixels emitting different colors of light on the substrate,
    wherein each of the plurality of sub-pixels comprises a green electroluminescence component;
    each of the plurality of the sub-pixels other than green sub-pixels further comprises a color conversion layer on a light-exiting side of the green electroluminescence component; and
    the plurality of sub-pixels comprise blue sub-pixels, and the color conversion layer in each of the blue sub-pixels comprises a down-conversion luminescence layer that converts green light into near-infrared light, and an second up-conversion luminescence layer that converts the near-infrared light into blue light on a light-exiting side of the down-conversion luminescence layer.

2. The array substrate according to claim 1, wherein the down-conversion luminescence layer comprises a fluoroboron-based fluorescent dye.

3. The array substrate according to claim 1, wherein the second up-conversion luminescence layer comprises a rare earth doped fluorescent dye.

4. The array substrate according to claim 3, wherein the rare earth doped fluorescent dye comprises a $Yb^{3+}/Tm^{3+}$ co-doped $Sb_2O_4$ phosphor.

5. The array substrate according to claim 1, wherein each of the blue sub-pixels further comprises a blue color resist on a light-exiting side of the second up-conversion luminescence layer.

6. The array substrate according to claim 1, wherein each of the green sub-pixels further comprises a green color resist on the light exiting side of the green electroluminescence component.

7. The array substrate according to claim 1, wherein each of the green sub-pixels further comprises a scattering structure on the light exiting side of the green electroluminescence component.

8. The array substrate according to claim 1, wherein each of the green sub-pixels further comprises a scattering structure on the light exiting side of only the green electroluminescence component.

9. A display panel comprising the array substrate according to claim 1.

10. A display apparatus comprising the display panel of claim 9.

11. The array substrate according to claim 1, wherein the plurality of sub-pixels comprises red sub-pixels and the color conversion layer in each of the red sub-pixels comprises a first up-conversion luminescence layer that converts green light into red light.

12. The array substrate according to claim 11, wherein the first up-conversion luminescence layer comprises one or a combination of materials selected from the group consisting of isothiocyanate (FITC), 5-carboxyfluorescein (FAM), cyan dye (Cy2), and a fluorescent dye.

13. The array substrate according to claim 11, wherein each of the red sub-pixels further comprises a red color resist on a light-exiting side of the first up-conversion luminescence layer.

14. An array substrate, comprising:
    a substrate; and
    a plurality of sub-pixels emitting different colors of light on the substrate,
    wherein each of the plurality of sub-pixels comprises a green electroluminescence component;
    each of the plurality of the sub-pixels other than green sub-pixels further comprises a color conversion layer on a light-exiting side of the green electroluminescence component;
    each of the green sub-pixels further comprises a scattering structure on the light exiting side of the green electroluminescence component; and
    the light-exiting side of the green electroluminescent component of each of the green sub-pixels is provided a light-transmitting insulating layer, and the scattering structure is an uneven light-exiting surface of the light-transmitting insulating layer.

15. The array substrate according to claim 14, wherein each of the plurality of sub-pixels other than the green sub-pixels further comprises a light-transmitting insulating layer between the green electroluminescence component and the color conversion layer, and the scattering structure is an uneven light-exiting surface of the light-transmitting insulating layer.

16. The array substrate according to claim 14, wherein the light-transmitting insulating layer is in direct contact with the substrate, and has a higher refractive index than the substrate.

17. A method of manufacturing an array substrate, comprising:
    forming a plurality of sub-pixels emitting different colors of light on a substrate, each of the plurality of sub-pixels including a green electroluminescence component;
    forming a color conversion layer over the green electroluminescent component in each of the plurality of sub-pixels other than green sub-pixels; and
    etching a surface of the light-transmitting insulating layer in each of the green sub-pixels to form an uneven light-exiting surface by an etching process.

18. The method of manufacturing an array substrate according to claim 17, before forming the color conversion layer, further comprising forming a light-transmitting insulating layer on the green electroluminescent component.

* * * * *